United States Patent
Yoo et al.

(10) Patent No.: US 9,202,798 B2
(45) Date of Patent: Dec. 1, 2015

(54) POWER MODULE PACKAGE AND METHOD FOR MANUFACTURING THE SAME

(71) Applicant: SAMSUNG ELECTRO-MECHANICS CO., LTD., Suwon (KR)

(72) Inventors: Do Jae Yoo, Suwon (KR); Sun Woo Yun, Suwon (KR); Joon Seok Chae, Suwon (KR); Kwang Soo Kim, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/846,626

(22) Filed: Mar. 18, 2013

(65) Prior Publication Data
US 2014/0003013 A1    Jan. 2, 2014

(30) Foreign Application Priority Data

Jun. 29, 2012   (KR) ................. 10-2012-0070667

(51) Int. Cl.
*H01L 23/00* (2006.01)
*H05K 1/18* (2006.01)
(Continued)

(52) U.S. Cl.
CPC ............ *H01L 24/80* (2013.01); *H01L 23/3735* (2013.01); *H01L 23/42* (2013.01); *H01L 23/49811* (2013.01); *H01L 23/49861* (2013.01); *H01L 25/072* (2013.01); *H05K 3/4015* (2013.01); *H01L 23/24* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/2929* (2013.01); *H01L 2224/29101* (2013.01); *H01L 2224/32225* (2013.01); *H01L 2224/45124* (2013.01); *H01L 2224/45144* (2013.01);
(Continued)

(58) Field of Classification Search
CPC ..... H01L 25/165; H01L 24/80; H01L 25/072; H01L 23/00; H02M 7/003; H05K 7/1432; H05K 1/181; H05K 1/18
USPC ....... 361/772, 742, 758, 770, 804; 174/138 R
See application file for complete search history.

(56) References Cited

U.S. PATENT DOCUMENTS 4,812,949 A *  3/1989  Fontan et al. ................. 361/719
5,592,021 A *  1/1997  Meschter et al. ............. 257/727
(Continued)

FOREIGN PATENT DOCUMENTS

JP    2005-217093    8/2005
JP    2010-129795    6/2010
(Continued)

OTHER PUBLICATIONS

Non-Final Office Action dated Mar. 18, 2015 for U.S. Appl. No. 13/846,591 (now published as U.S. 2014/0001619 A1).
(Continued)

*Primary Examiner* — Michael P McFadden
(74) *Attorney, Agent, or Firm* — Ladas & Parry, LLP (57) ABSTRACT

Disclosed herein is a power module package including an external connection terminal; a substrate in which a fastening unit allowing one end of the external connection terminal to be insertedly fastened thereinto is buried at a predetermined depth in a thickness direction; and a semiconductor chip mounted on one surface of the substrate.

12 Claims, 9 Drawing Sheets

(51) Int. Cl.
*H05K 3/40* (2006.01)
*H01L 25/07* (2006.01)
*H01L 23/373* (2006.01)
*H01L 23/42* (2006.01)
*H01L 23/498* (2006.01)
*H01L 23/24* (2006.01)

(52) U.S. Cl.
CPC ............... *H01L 2224/45147* (2013.01); *H01L 2224/48091* (2013.01); *H01L 2224/48137* (2013.01); *H01L 2224/48227* (2013.01); *H01L 2224/49109* (2013.01); *H01L 2224/73265* (2013.01); *H01L 2924/12042* (2013.01); *H01L 2924/1305* (2013.01); *H01L 2924/13034* (2013.01); *H01L 2924/13055* (2013.01); *H01L 2924/13091* (2013.01); *H01L 2924/15787* (2013.01); *H01L 2924/16151* (2013.01); *H01L 2924/181* (2013.01); *H05K 1/181* (2013.01); *H05K 2201/10295* (2013.01); *H05K 2201/10393* (2013.01); *H05K 2201/10962* (2013.01)

(56) References Cited

U.S. PATENT DOCUMENTS

| | | | |
|---|---|---|---|
| 5,920,119 A | 7/1999 | Tamba et al. | |
| 6,297,549 B1 * | 10/2001 | Hiyoshi | 257/703 |
| 6,421,244 B1 | 7/2002 | Shinohara et al. | |
| 6,861,747 B2 * | 3/2005 | Miyazaki et al. | 257/718 |
| 7,663,232 B2 * | 2/2010 | Kinsley | 257/726 |
| 2005/0045369 A1 * | 3/2005 | Ishimaru et al. | 174/250 |
| 2007/0284947 A1 | 12/2007 | Lee et al. | |
| 2010/0165576 A1 * | 7/2010 | Lee et al. | 361/709 |
| 2012/0127668 A1 | 5/2012 | Yamamoto et al. | |

FOREIGN PATENT DOCUMENTS

| | | |
|---|---|---|
| KR | 10-2007-0103876 | 10/2007 |
| KR | 10-2012-0018781 | 3/2012 |
| KR | 10/2012-0092371 | 8/2012 |
| WO | 2011/016175 | 2/2011 |

OTHER PUBLICATIONS

Final Office Action dated Nov. 20, 2014 for U.S. Appl. No. 13/846,591 (now published as U.S. 2014/0001619 A1).

Non-Final Office Action dated May 21, 2014 for U.S. Appl. No. 13/846,591 (now published as U.S. 2014/0001619 A1).

Restriction Requirement dated Apr. 7, 2014 for U.S. Appl. No. 13/846,591 (now published as U.S. 2014/0001619 A1).

Office Action dated Aug. 5, 2015 for Chinese Patent Application No. 201210593909.3 and its English translation provided by Applicants' foreign counsel.

* cited by examiner

POWER MODULE PACKAGE AND METHOD FOR MANUFACTURING THE SAME

CROSS REFERENCE TO RELATED APPLICATION

This application claims the benefit of Korean Patent Application No. 10-2012-0070667, filed on Jun. 29, 2012, entitled "Power Module Package and Method for Manufacturing the Same", which is hereby incorporated by reference in its entirety into this application.

BACKGROUND OF THE INVENTION

1. Technical Field

The present invention relates to a power module package and a method for manufacturing the same.

2. Description of the Related Art

Recently, as electronic industries for power have been developed, electronic products have been increasingly reduced and have higher density. Thus, besides a method of reducing the size of electronic elements, a method of installing elements and conducting wires as many as possible in a determined space is a critical issue in designing a power module package.

Meanwhile, a structure of a related art power module package is disclosed in U.S. Pat. No. 5,920,119.

SUMMARY OF THE INVENTION

The present invention has been made in an effort to provide a power module package and a method for manufacturing the same, capable of eliminating or facilitating a packaging process for coupling an external connection terminal fastening unit to a substrate and preventing a generation of solder cracks between an external connection terminal and a substrate to thus implement high reliability.

According to a first preferred embodiment of the present invention, there is provided a power module package, including: an external connection terminal; a substrate in which a fastening unit allowing one end of the external connection terminal to be insertedly fastened thereinto is buried at a predetermined depth in a thickness direction; and a semiconductor chip mounted on one surface of the substrate.

The substrate may include: an insulating material; a circuit layer formed on one surface of the insulating material and including a chip mounting pad and an external connection pad; and a metal layer formed on the other surface of the insulating material, and the fastening unit may be made of a conductive material and a part of the fastening unit may contact the external connection pad.

The substrate may include: an insulating material; a circuit layer formed on one surface of the insulating material and including a chip mounting pad and an external connection pad; and a metal layer formed on the other surface of the insulating material, and the fastening unit may be made of a nonconductive material, and the power module package may further include a lead frame electrically connecting the external connection terminal to the external connection pad.

The fastening unit may further include a groove into which the external connection terminal formed therein is inserted, and a suspending groove and a suspending protrusion corresponding to the suspending groove may be formed in the groove and the external connection terminal inserted into the groove, respectively.

The power module package may further include: a case formed on the substrate so as to cover one surface of the substrate and the semiconductor chip and expose the other end of the external connection terminal to the outside.

The power module package may further include: a sealing member formed in the case so as to cover the one surface of the substrate and the semiconductor chip.

According to a second preferred embodiment of the present invention, there is provided a method for manufacturing a power module package, the method including: preparing a substrate in which a fastening unit with a groove for insertedly fastening an external connection terminal formed therein is buried at a predetermined depth in a thickness direction; mounting a semiconductor chip on the substrate; and insertedly fastening one end of the external connection terminal into the groove of the fastening unit.

In this case, the preparing of the substrate in which the fastening unit is buried at the predetermined depth in the thickness direction may include: preparing an insulating material; forming a trench of a predetermined depth on one surface of the insulating material; disposing a circuit layer from which a portion corresponding to the trench is removed, on one surface of the insulating material; disposing a metal layer on the other surface of the insulating material; and insertedly fastening unit into the trench and integrating the insulating material, the circuit layer, the metal layer, and the fastening unit.

The method may further include: forming a chip mounting pad and an external connection pad by patterning the circuit layer, after the integrating of the insulating material, the circuit layer, the metal layer, and the fastening unit, wherein the semiconductor chip is mounted on the chip mounting pad.

The fastening unit may be made of a conductive material, and the external connection pad may be formed to contact the fastening unit.

The fastening unit may be made of a nonconductive material, and the method may further include: forming a lead frame for electrically connecting the external connection terminal to the external connection pad, after the forming of the chip mounting pad and the external connection pad.

The integrating of the insulating material, the circuit layer, the metal layer, and the fastening unit may be performed through heating and co-firing.

The forming of the trench may be performed by using a laser drill.

The preparing of the substrate in which the fastening unit is buried at the predetermined depth in the thickness direction may include: preparing an insulating material; forming a trench of a predetermined depth on one surface of the insulating material; disposing a circuit layer from which a portion corresponding to the trench is removed, on one surface of the insulating material; disposing a metal layer on the other surface of the insulating layer; and integrating the insulating material, the circuit layer, the metal layer, and the fastening unit.

The method may further include: forming a chip mounting pad and an external connection pad by patterning the circuit layer, after the integrating of the insulating material, the circuit layer, the metal layer, and the fastening unit, wherein the semiconductor chip is mounted on the chip mounting pad.

The fastening unit may be made of a conductive material, and the external connection pad may be formed to contact the fastening unit.

The fastening unit may be made of a nonconductive material, and the method may further include: forming a lead frame for electrically connecting the external connection terminal to the external connection pad, after the forming of the chip mounting pad and the external connection pad.

The integrating of the insulating material, the circuit layer, the metal layer, and the fastening unit may be performed through heating and co-firing.

The method may further include: forming a case formed on the substrate so as to cover one surface of the substrate and the semiconductor chip and expose the other end of the external connection terminal to the outside, after the insertedly fastening of the one end of the external connection terminal into the groove of the fastening unit.

The method may further include: forming a molding member that covers the one surface of the substrate and the semiconductor chip by injecting a molding material into the case, after the forming of the case.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the prior art would obscure the gist of the present invention, the description thereof will be omitted.

Hereinafter, preferred embodiments of the present invention will be described in detail with reference to the attached drawings.

Power Module Package

<First Preferred Embodiment>

Figure 1A:
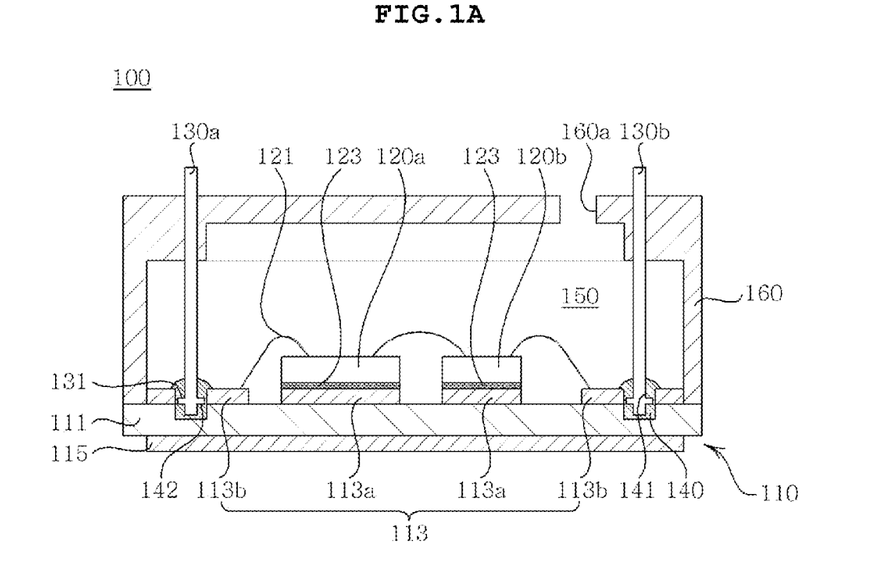
FIGS. 1A and 1B are cross-sectional view illustrating the structure of a power module package according to a first preferred embodiment of the present invention.
Figure 1B:
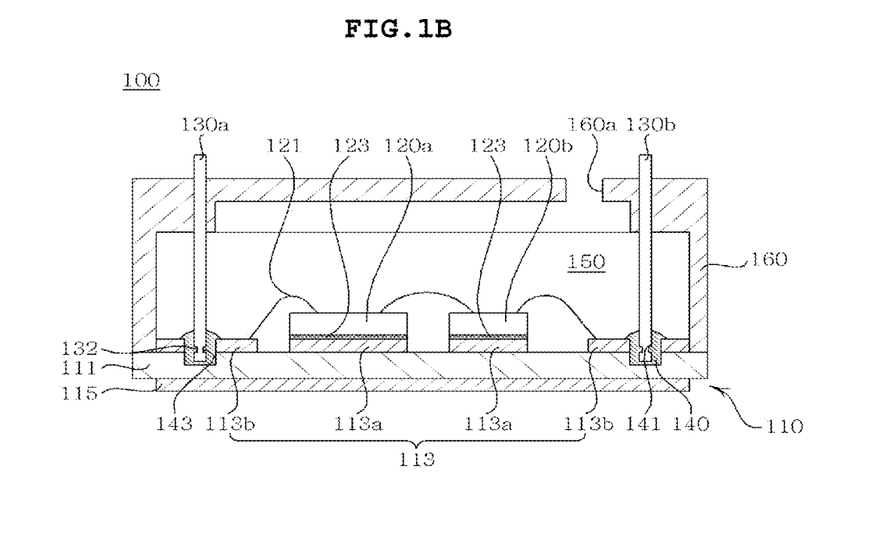

FIGS. 1A and 1B are a cross-sectional view illustrating the structure of a power module package according to a first preferred embodiment of the present invention.

Referring to FIGS. 1A and 1B, the power module package 100 according to the preferred embodiment includes external connection terminals 130a and 130b, a substrate 110 into which a fastening unit ends of the external connection terminals 130a and 130b are insertedly fastened is buried at a predetermined depth in a thickness direction, and semiconductor chips 120a and 120b mounted on one surface of the substrate 110.

In the present embodiment, the substrate 110 may include an insulating material 111, a circuit layer 113 formed on one surface of the insulating material 111, and a metal layer 115 formed on the other surface of the insulating material 111.

In this case, as the insulating material 111, ceramic may be used, but the insulating material 111 is not particularly limited thereto.

In the present embodiment, the substrate 110 has one surface and the other surface. In this case, the one surface means a surface on which the semiconductor chips 120a and 120b are mounted, that is, a surface on which the circuit layer 113 including a chip mounting pad 113a and an external connection pad 113b is formed, and the other surface may mean a surface opposite thereto, that is, a surface on which the metal layer 115 is formed, with reference to FIG. 1.

In the present embodiment, as described above, a direct bonded copper (DBC) substrate including the insulating material 111, the circuit layer 113, and the metal layer 115 is exemplified as the substrate 110, but the substrate 110 is not particularly limited thereto and may include, for example, a metal substrate having an anode oxidation layer, a printed circuit board (PCB), a ceramic substrate, a substrate including a metal plate, an insulating layer, and a circuit pattern, and the like.

The external connection terminals 130a and 130b are components electrically connected to an external driving IC to drive the semiconductor chips 120a and 120b mounted on the substrate 110. In the present embodiment, as shown in FIG. 1, the external connection terminals 130a and 130b are formed as pin type terminals, but the present invention is not particularly limited thereto.

Here, the semiconductor chips 120a and 120b may be power elements. The power elements may include a silicon controlled rectifier (SCR), a power transistor, an insulated gate bipolar transistor (IGBT), a MOS transistor, a power rectifier, a power regulator, an inverter, a converter, or a high power semiconductor chip or a diode configured by combining these elements.

In the present embodiment, a bonding layer 123 may be formed between the semiconductor chips 120a and 120b, and the chip mounting pad 113a, and the bonding layer 123 may be configured by solder or conductive epoxy having relatively high thermal conductivity in order to effectively dissipate heat, but is not particularly limited thereto.

In the present embodiment, the semiconductor chips 120a and 120b, and the substrate 110 and the external connection terminals 130a and 130b may be electrically connected with each other by using a wire 121, but are not particularly limited thereto.

In this case, the wire bonding process may be performed as ball bonding, wedge bonding, and stitch bonding which are well known in the art, but is not particularly limited thereto.

Here, the wires 121 may be made of aluminum (Al), gold (Al), copper (Cu), and the like, but the present invention is not particularly limited thereto. Wires made of aluminum (Al) applying a high rated voltage to the semiconductor chips 120a and 120b as power elements are generally used. This is because, in order to withstand high voltages, a thick wire is used, and here, the use of aluminum, rather than gold (Au) or copper (Cu), is more effective in terms of cost reduction.

In the present embodiment, the fastening unit 140 allowing the external connection terminals 130a and 130b to be insertedly fastened therethrough, is buried in the substrate 110 at a predetermined depth in a thickness direction.

Here, groovees 141 allowing the external connection terminals 130a and 130b to be inserted therethrough may be formed in a length direction within the fastening units 140.

In order to enhance fastening force between the external connection terminals 130a and 130b, and the fastening unit 140, a suspending groove (142) (or suspending protrusion (143)) may be formed in the groove 141 of the fastening unit 140 and a suspending protrusion (131) (or suspending groove (132)) may be formed in the external connection terminals 130a and 130b inserted thereinto.

In the present embodiment, the fastening unit 140 may be made of a conductive material, but is not particularly limited thereto.

However, as the fastening unit 140 is made of the conductive material, but the external connection terminals 130a and 130b insertedly fastened into the fastening unit 140 and an external connection pad 113b that contacts the fastening unit 140 made of the conductive material may be electrically connected with each other without an addition configuration.

The power module package 100 according to the preferred embodiment may further include a case 160 that is formed to cover one surface of the substrate 110 and the semiconductor chips 120a and 120b, and expose the other ends of the external connection terminals 130a and 130b to the outside as illustrated in FIG. 1.

In this case, the case 160 may include an open region 160a allowing a molding material to be injected into the case 160 therethrough.

The power module package 100 according to the preferred embodiment may further include a sealing member 150 that is formed to cover one surface of the substrate 110, the semiconductor chips 120a and 120b, and the wires 121 electrically connecting the semiconductor chips 120a and 120b in the case 160.

In this case, as the sealing member 150, a silicon gel or an epoxy molded compound (EMC) may be used, but the sealing member 150 is not particularly limited thereto.

Also, although not shown, the power module package 100 according to the present embodiment may further include a heat sink bonded to the other surface of the substrate 110, namely, the exposed portion of the metal layer 115.

The heat sink may include a plurality of heat dissipating fins for dissipating heat generated from the semiconductor chips 120a and 120b to the air.

Also, the heat sink is generally made of or coated with copper (Cu) or tin (Sn) in order to obtain excellent heat transmission and be easily bonded with a heat dissipation substrate. However, the present invention is not particularly limited thereto.

In the present embodiment, since the fastening units 140 for insertedly fastening the external connection terminals 130a and 130b are formed to be buried in the substrate 110, a possibility of generating cracks at the bonded interface may be prevented in comparison to the related art in which a member for connecting an external connection terminal is bonded to a substrate through soldering, and thus, reliability of the product can be enhanced.

<Second Preferred Embodiment>

Figure 2A:
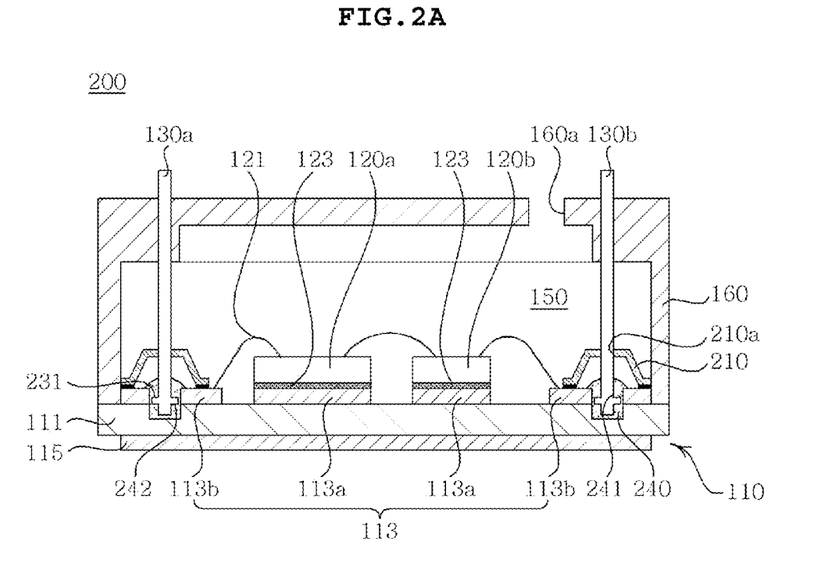
FIGS. 2A and 2B are a cross-sectional view illustrating the structure of a power module package according to a second preferred embodiment of the present invention.
Figure 2B:
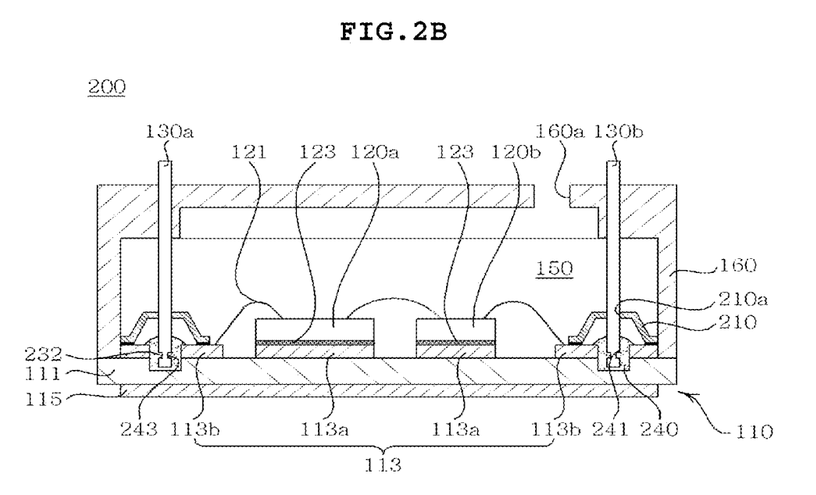

FIGS. 2A and 2B are a cross-sectional view illustrating the structure of a power module package according to a second preferred embodiment of the present invention.

In the second embodiment, a description of the same components as those of the first embodiment described above will be omitted and the same reference numerals will be used for the same components as those of the first embodiment.

Referring to FIGS. 2A and 2B, like the first embodiment, a power module package 200 according to the present embodiment includes the external connection terminals 130a and 130b, the substrate 110 including fastening units 240 into which ends of the external connection terminals 130a and 130b are insertedly fastened is buried at a predetermined depth in a thickness direction, and the semiconductor chips 120a and 120b mounted on one surface of the substrate 110.

Here, the power module package 200 may further include lead frames 210 for electrically connecting the external connection terminals 130a and 130b to the external connection pads 113b.

In the present embodiment, the fastening unit 240 that is buried in the substrate 110 at a predetermined depth may be made of a nonconductive material, unlike the fastening unit 140 according to the first preferred embodiment.

As a result, since the external connection terminals 130a and 130b insertedly fastened into the fastening unit 240, and the external connection pad 115b may not be electrically connected with each other, the lead frame 210 for electrically connecting them is additionally bonded.

In this case, the lead frame 210 and the external connection pad 113b may be bonded to each other by using solder or a conductive epoxy, but the present invention is not particularly limited thereto.

A hole 210a having a size to penetrate the external connection terminals 130a and 130b may be formed in the lead frame 210, and the ends of the external connection terminals 130a and 130b may be insertedly fastened into the fastening unit 240 by penetrating the holes 210a of the lead frame 210.

In this case, the solder or conductive epoxy may be additionally formed in the portions in which the external connection terminals 130a and 130b and the lead frame 210 contact each other, that is, the holes 210a of the lead frame 210, whereby bonding force may also be increased.

Meanwhile, although not illustrated in the figure, when the fastening unit 240 is made of the nonconductive material, the power module package 200 may include a combination member that is combined into the fastening unit 240 in a screw method instead of the lead frame 210 and contacts the groovees into which the external connection terminals 130a and 130b are inserted and the external connection pad 113b, as another preferred embodiment.

In this case, a screw thread (or screw groove) may be formed on the outer peripheral surface of a portion that protrudes from the substrate 110 except for a portion of the fastening unit 240 buried in the substrate 110.

The combination member is made of the conductive material, and may include a body section including a cylindrical first body portion with groovees for inserting the external connection terminals 130a and 130b and a hollow cylindrical second body portion combined to the fastening unit 240 while being connected with the first body portion, and a connection section of which one end is formed integrally with an outer wall of the body section and the other end contacts the external connection pad 113b.

In this case, a screw groove (or screw thread) corresponding to a screw thread (or screw groove) formed on the outer peripheral surface of a portion of the fastening unit 240 that protrudes from the substrate 110 may be formed on an inner wall of the second body portion.

A suspending groove (242) (or suspending protrusion (243)) may be formed in the groove formed in the first body portion and a suspending protrusion (231) (or suspending groove (232)) may be formed in the external connection terminals 130a and 130b inserted thereinto.

Method for Manufacturing Power Module Package

<First Preferred Embodiment>

Figure 14:
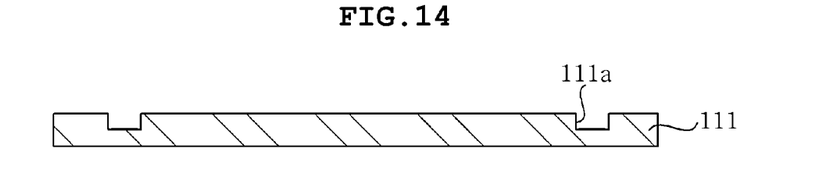
FIGS. 14 to 16 are cross-sectional views sequentially illustrating a substrate manufacturing process in a second method for manufacturing the power module package according to the first preferred embodiment of the present invention.
Figure 15:
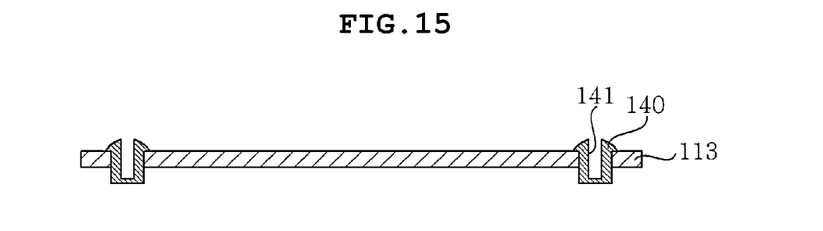
Figure 16:
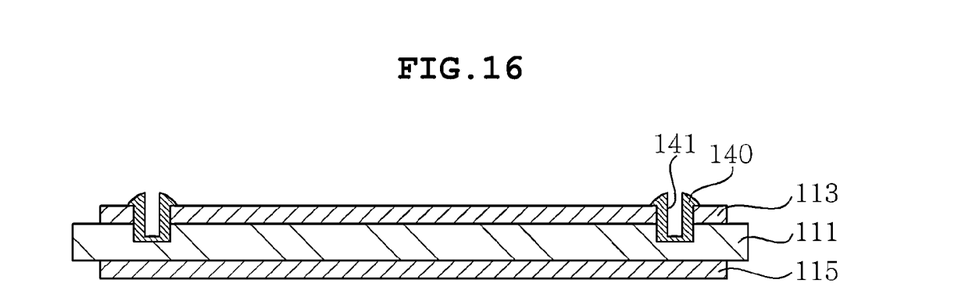

FIGS. 3 to 9 are cross-sectional views sequentially illustrating the process of a first method for manufacturing the power module package according to the first preferred embodiment of the present invention. FIGS. 14 to 16 are cross-sectional views sequentially illustrating a substrate manufacturing process in a second method for manufacturing the power module package according to the first preferred embodiment of the present invention.

Figure 3:
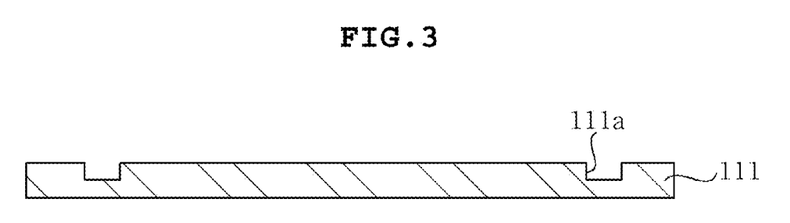
FIGS. 3 to 9 are cross-sectional views sequentially illustrating the process of a first method for manufacturing the power module package according to the first preferred embodiment of the present invention.

First, referring to FIG. 3, an insulating material 111 with a trench 111a formed on one surface thereof is prepared.

In the present embodiment, the insulating material 111 may be made of ceramic, but is not particularly limited thereto.

In the present embodiment, the trench 111a may be formed by using a laser drill, but is not particularly limited thereto.

The trench 111a may be formed up to a predetermined depth in a thickness direction from the surface of the insulating material 111 and a part of the fastening unit 140, that is, a bottom, may be inserted into the trench 111a formed as such in a subsequent process.

Figure 4:
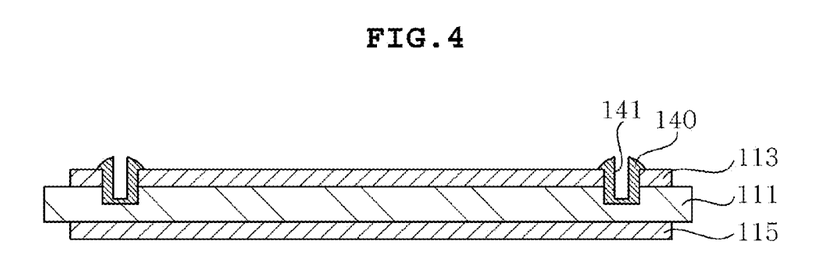

Next, referring to FIG. 4, the insulating material 111, a circuit layer 113, a metal layer 115, and a fastening unit 140 are integrated through bonding.

This step will be described in detail below.

First, the circuit layer 113 where a portion corresponding to the trench 111a is removed is placed on one surface of the insulating material 111 with the trench 11a formed on one surface thereof and the metal layer 115 is placed on the other surface of the insulating material 111 and thereafter, the fastening unit 140 is inserted into the removed portion in the circuit layer 113 and the trench 111a, and thereafter, heated and cofired.

Meanwhile, as illustrated in FIGS. 14 to 16, the step may be progressed in a sequence in which the insulating material 111 with the trench 111a formed on one surface thereof is prepared, the circuit layer 113 with the fastening unit 140 formed at a portion corresponding to the trench 111a is prepared, and thereafter, the circuit layer 113 is placed on one surface of the insulating material 111 so that the fastening unit 140 is inserted into the trench 111a and the metal layer 115 is placed on the other surface of the insulating material 111, and thereafter, heated and cofired.

As a result, the insulating material 111, the circuit layer 113, the metal layer 115, and the fastening unit 140 may be integrated.

In the present embodiment, the circuit layer 113 and the metal layer 115 may be made of copper (Cu), but are not particularly limited thereto.

In the present embodiment, the fastening unit 140 may be made of a conductive material, but is not particularly limited thereto.

As such, the fastening unit 140 into which the external connection terminals 130a and 130b are insertedly fastened is buried in the substrate 110 at a predetermined depth in a thickness direction, such that the fastening unit 140 may be formed at a comparatively accurate position as compared with a fastening unit bonding method through soldering in the prior art.

As such, as the fastening unit 140 is formed at the comparatively same position for each module, an external connection terminal inserting process may also be smoothly progressed.

Figure 5:
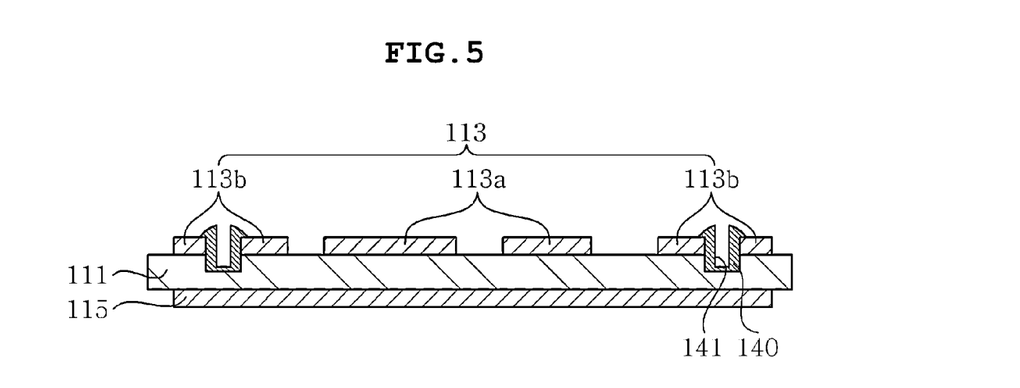

Next, referring to FIG. 5, the circuit layer 113 is patterned to form a chip mounting pad 113a and an external connection pad 113b.

In this case, the external connection pad 113b may be formed to contact the fastening unit 140, and as a result, the external connection terminals 130a and 130b insertedly fastened into the fastening unit 140 made of the conductive material, and the external connection pad 113b may be electrically connected without an additional configuration.

Figure 6:
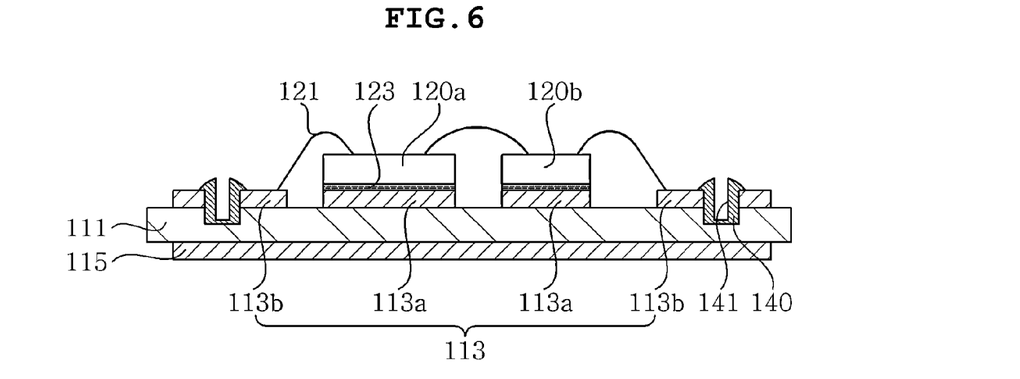

Next, referring to FIG. 6, semiconductor chips 120a and 120b are bonded to the chip mounting pad 113a.

In this case, the semiconductor chips 120a and 120b, and the chip mounting pad 113a may be bonded to each other by using solder or a conductive epoxy, but are not particularly limited thereto.

As such, the semiconductor chips 120a and 120b are bonded to the chip mounting pad 113a and thereafter, the semiconductor chips 120a and 120b and the circuit pattern 113 are electrically connected to each other through a wire bonding process using a wire 121.

In this case, the wire bonding process may be performed as ball bonding, wedge bonding, and stitch bonding which are well known in the art, but is not particularly limited thereto.

Here, the wires 121 may be made of aluminum (Al), gold (Al), copper (Cu), and the like, but the present invention is not particularly limited thereto. Wires made of aluminum (Al) applying a high rated voltage to the semiconductor chips 120a and 120b as power elements are generally used. This is because, in order to withstand high voltages, a thick wire is used, and here, the use of aluminum, rather than gold (Au) or copper (Cu), is more effective in terms of cost reduction.

Figure 7:
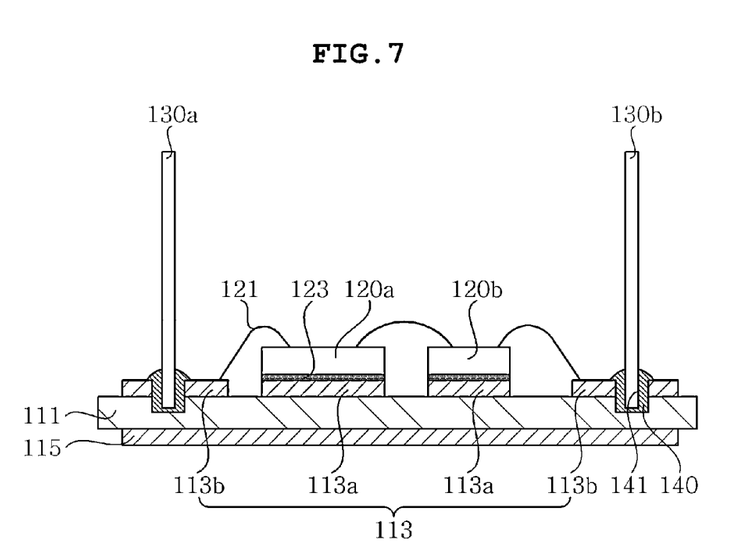

Next, referring to FIG. 7, ends of the external connection terminals 130a and 130b are insertedly fastened into groovees 141 of the fastening unit 140.

Here, in order to enhance fastening force between the external connection terminals 130a and 130b and the fastening units 140, a suspending groove (or suspending protrusion) (not shown) may be formed within the groovees 141 of the fastening units 140, and a suspending protrusion (or suspending groove) (not shown) corresponding to the suspending groove (or suspending protrusion) (not shown) may be formed on inserted portions of the external connection terminals 130a and 130b, but the present invention is not particularly limited thereto.

Figure 8:
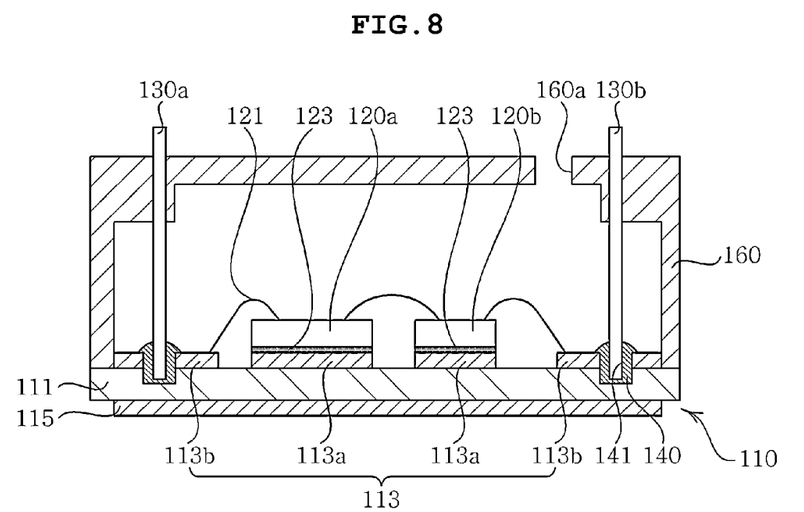

Next, referring to FIG. 8, a case 160 is formed, which is mounted with the semiconductor chips 120a and 120b, covers one surface of the substrate 110, and the semiconductor chips 120a and 120b on the substrate 110 into which the external connection terminals 130a and 130b are insertedly fastened, and exposes the other ends of the external connection terminals 130a and 130b to the outside.

In this case, the case 160 may include an open region 160a allowing a molding material to be injected into the case 160 therethrough.

Figure 9:
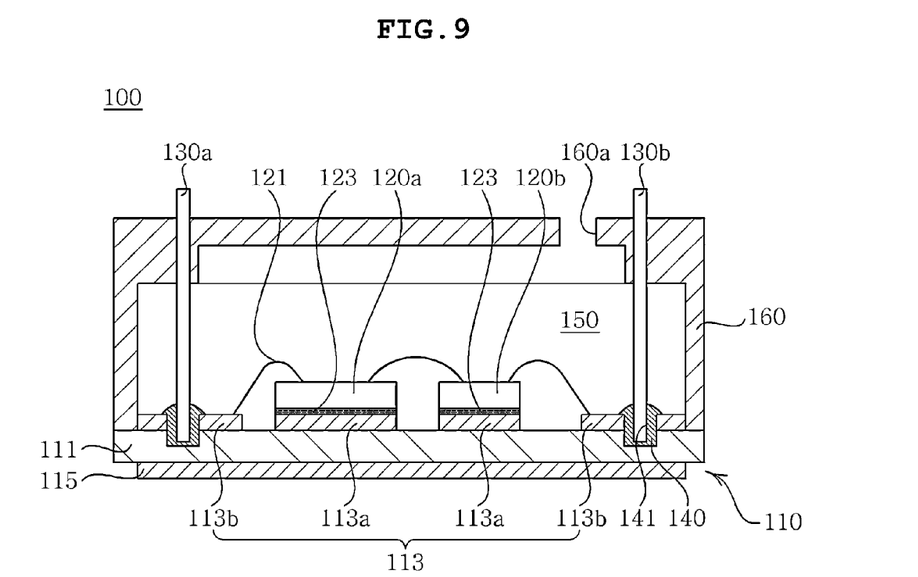

Next, referring to FIG. 9, the molding material is filled in the case 160 through the open region 160a to form a sealing member 150 covering one surface of the substrate 110 and the semiconductor chips 120a and 120b.

Here, a silicon gel, an epoxy molded compound (EMC), or the like, may be used as the molding material, but the present invention is not particularly limited thereto.

<Second Preferred Embodiment>

Figure 10:
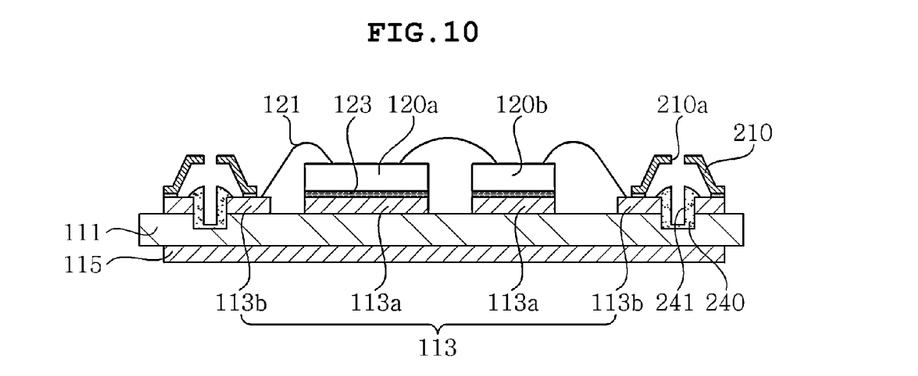
FIGS. 10 to 13 are cross-sectional views sequentially illustrating the process of a method for manufacturing a power module package according to a second preferred embodiment of the present invention.
Figure 11:
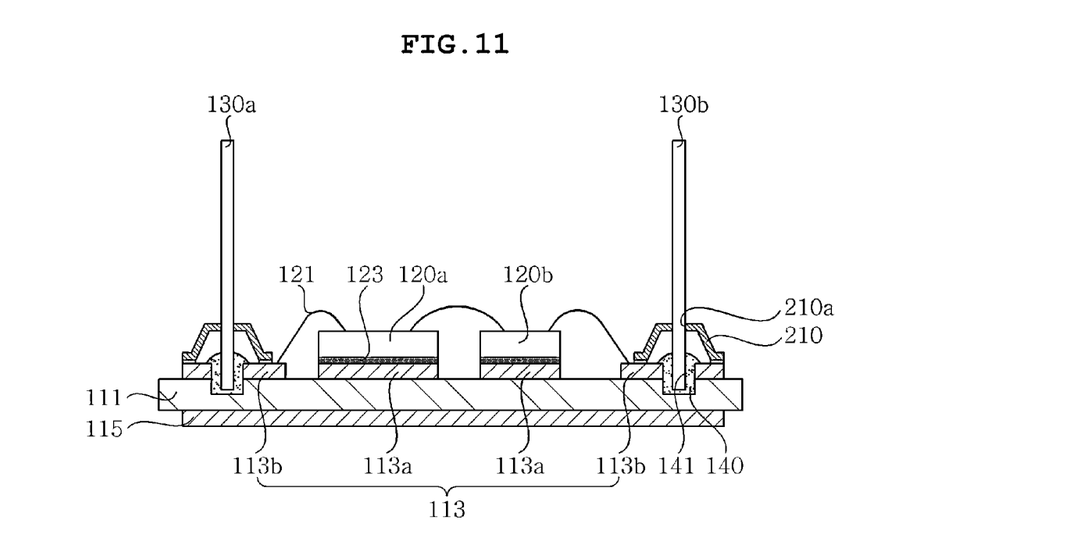
Figure 12:
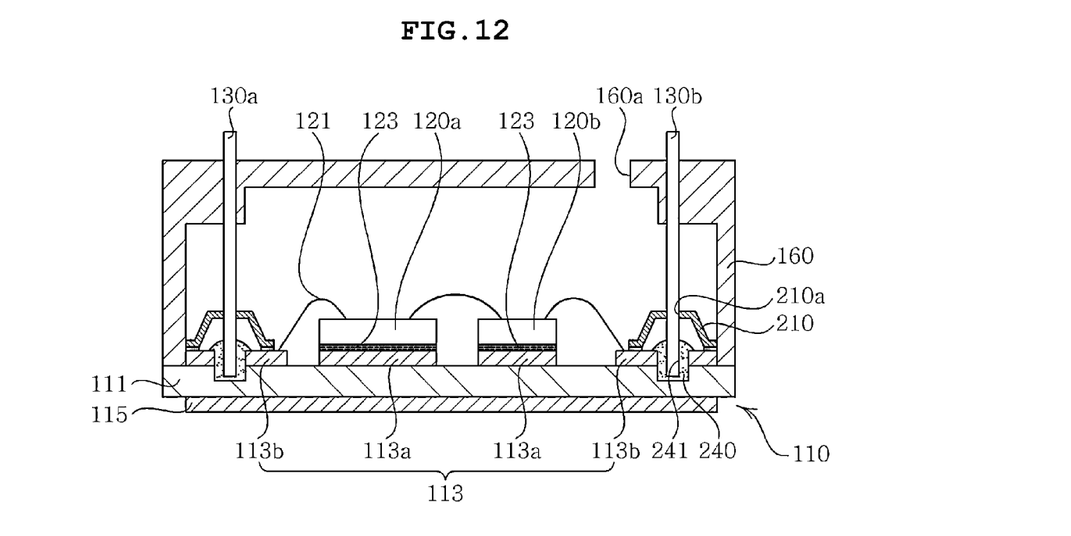

FIGS. 10 to 12 are cross-sectional views sequentially illustrating the process of a method for manufacturing a power module package according to a second preferred embodiment of the present invention.

In the present embodiment, a description of the same components as those of the first embodiment described above will be omitted and the same reference numerals will be used for the same components as those of the first embodiment.

In the preferred embodiment, the step of integrating the insulating material, the circuit layer, the metal layer, and the fastening unit is same as those in the first preferred embodiment, and as a result, a description thereof will be omitted.

In the present embodiment, a fastening unit 240 may be made of a nonconductive material.

Referring to FIG. 10, the semiconductor chips 120a and 120b are mounted on the chip mounting pad 113a of the substrate 110 and a lead frame 210 is bonded to the external connection pad 113b.

In this case, the semiconductor chips 120a and 120b, the chip mounting pad 113a, the lead frame 210, and the external connection pad 115b may be bonded by using solder or conductive epoxy, but are not particularly limited thereto.

The lead frame 210 used in the present embodiment may have a hole 210a formed at the center thereof, as illustrated in FIG. 16.

The hole 210a is a portion which the external connection terminals 130a and 130b penetrate in a subsequent process, the position of the hole 210a corresponds to the position of a groove 241 of the fastening unit 240, and the diameter thereof may be the same as the diameters of the groove 241 of the fastening unit 240 and the external connection terminals 130a and 130b, but are not particularly limited thereto.

Next, referring to FIG. 11, one end of each of the external connection terminals 130a and 130b penetrate the hole 210a of the lead frame 210 to be insertedly fastened into the groove 241 of the fastening unit 240.

In this case, a suspending groove (or suspending protrusion) (not shown) may be formed in the groove 241 of the fastening unit 240 in order to enhance the fastening force, and a suspending protrusion (or suspending groove) (not shown) corresponding to the suspending groove (or suspending protrusion) (not shown) may be formed in the external connection terminals 130a and 130b inserted thereinto.

Next, although not illustrated in the figure, in order to enhance the fastening force between the external connection terminals 130a and 130b, and the lead frame 210 which is in contact therewith, the hole 210a of the lead frame 210 and the external connection terminals 130a and 130b penetrating the hole 210a may be bonded to each other by using the solder or conductive epoxy.

Meanwhile, although not illustrated in the figure, when the fastening unit 240 is made of the nonconductive material, the power module package 200 may mechanically and electrically connects the external connection terminals 130a and 130b, and the substrate 110 by using a combination member having a connection portion that is combined into the fastening unit 240 in a screw method instead of the lead frame 210 and contacts the groovees into which the external connection terminals 130a and 130b are inserted and the external connection pad 113b, as another preferred embodiment.

In detail, the fastening unit 240 with a screw thread (or screw groove) formed on the outer peripheral surface of a portion other than a portion buried in the substrate 110 is prepared and the substrate 110 in which the prepared fastening unit 240 is integrated is formed.

Next, the combination member is prepared, which is made of the conductive material, and includes a body section including a cylindrical first body portion with groovees for inserting the external connection terminals 130a and 130b and a hollow cylindrical second body portion combined to the fastening unit 240 while being connected with the first body portion, and a connection section of which one end is formed integrally with an outer wall of the body section and the other end contacts the external connection pad 113b.

In this case, a screw groove (or screw thread) corresponding to a screw thread (or screw groove) formed on the outer peripheral surface of a portion of the fastening unit 240 that protrudes from the substrate 110 may be formed on an inner wall of the second body portion.

A suspending groove (or suspending protrusion) may be formed in the groove formed in the first body portion and a suspending protrusion (or suspending groove) (not shown) corresponding to the suspending groove (or suspending protrusion) (not shown) may be formed in the external connection terminals 130a and 130b inserted thereinto.

Next, the combination member is fastened to the fastening unit 240 in a screw method, and the external connection terminals 130a and 130b are insertedly fastened into the groovees of the combination member.

In the above manner, the external connection terminals 130a and 130b are connected with the substrate 110, such that an additional bonding process is not required to save process cost, and since the combination member is just fastened to the fastening unit in the screw method and the external connection terminals fit in the groovees of the combination members, the process may be simplified.

Figure 13:
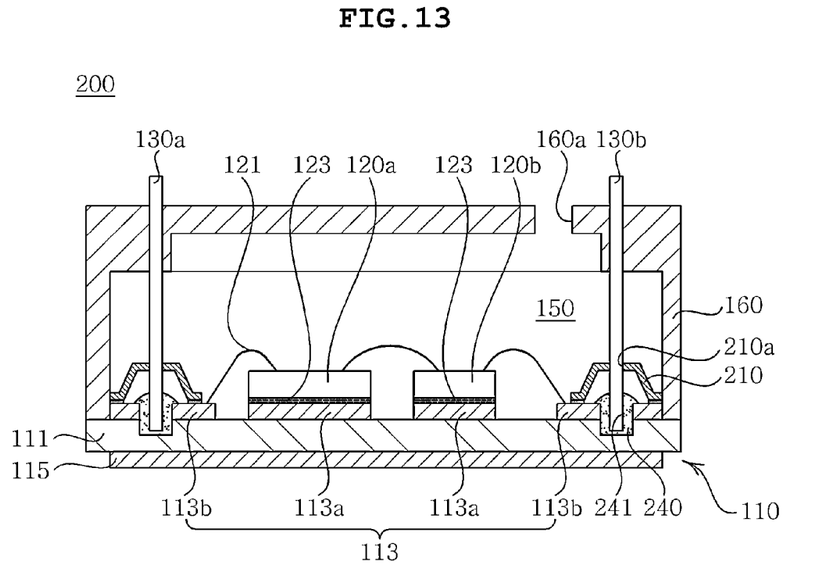

Next, referring to FIGS. 12 and 13, the case 160 is formed on the substrate 110, and the molding material is injected into the open region 160a of the case 160 to form a molding member 150 covering one surface of the substrate 110 and the semiconductor chips 120a and 120b.

According to the preferred embodiments of the present invention, since a process for bonding a unit for fastening an external connection terminal to the substrate is not necessary, the number of processes can be reduced, simplifying the processes.

Also, since the fastening unit for inserting the external connection terminal is installed within the substrate, positions of fastening units are relatively uniform in manufacturing respective products, and thus, the external connection terminals can be easily fastened.

In addition, since the fastening unit for inserting the external connection terminal is installed in the substrate, there is no possibility that cracks are generated in the interface of the substrate and the fastening unit in comparison to the related art fastening unit mounted on the substrate through soldering, enhancing reliability of the product.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A method for manufacturing a power module package, the method comprising:
preparing a substrate in which a fastening unit with a groove for insertedly fastening an external connection terminal formed therein is buried at a predetermined depth in a thickness direction;
mounting a semiconductor chip on the substrate;
insertedly fastening one end of the external connection terminal into the groove of the fastening unit; and forming a case formed on the substrate so as to cover one surface of the substrate and the semiconductor chip and expose the other end of the external connection terminal to the outside, wherein the preparing of the substrate in which the fastening unit is buried at the predetermined depth in the thickness direction includes:

preparing an insulating material;

forming a trench of a predetermined depth on one surface of the insulating material;

disposing a circuit layer from which a portion corresponding to the trench is removed, on one surface of the insulating material;

disposing a metal layer on the other surface of the insulating material; and inserting the fastening unit into the trench and integrating the insulating material, the circuit layer, the metal layer, and the fastening unit.

2. The method as set forth in claim 1, further comprising:
forming a chip mounting pad and an external connection pad by patterning the circuit layer, after the integrating of the insulating material, the circuit layer, the metal layer, and the fastening unit, wherein the semiconductor chip is mounted on the chip mounting pad.

3. The method as set forth in claim 2, wherein the fastening unit is made of a conductive material, and
the external connection pad is formed to contact the fastening unit.

4. The method as set forth in claim 2, wherein the fastening unit is made of a nonconductive material, and
the method further comprising:
forming a lead frame for electrically connecting the external connection terminal to the external connection pad, after the forming of the chip mounting pad and the external connection pad.

5. The method as set forth in claim 1, wherein the integrating of the insulating material, the circuit layer, the metal layer, and the fastening unit is performed through heating and co-firing.

6. The method as set forth in claim 1, wherein the forming of the trench is performed by using a laser drill.

7. The method as set forth in claim 1, wherein the preparing of the substrate in which the fastening unit is buried at the predetermined depth in the thickness direction includes:

preparing an insulating material;

forming a trench of a predetermined depth on one surface of the insulating material;

disposing a circuit layer from which a portion corresponding to the trench is removed, on one surface of the insulating material;

disposing a metal layer on the other surface of the insulating layer; and integrating the insulating material, the circuit layer, the metal layer, and the fastening unit.

8. The method as set forth in claim 7, further comprising:
forming a chip mounting pad and an external connection pad by patterning the circuit layer, after the integrating of the insulating material, the circuit layer, the metal layer, and the fastening unit, wherein the semiconductor chip is mounted on the chip mounting pad.

9. A method for manufacturing a power module package, the method comprising:

preparing a substrate in which a fastening unit with a groove for insertedly fastening an external connection terminal formed therein is buried at a predetermined depth in a thickness direction;

mounting a semiconductor chip on the substrate;

insertedly fastening one end of the external connection terminal into the groove of the fastening unit; and forming a case formed on the substrate so as to cover one surface of the substrate and the semiconductor chip and expose the other end of the external connection terminal to the outside; and forming a chip mounting pad and an external connection pad by patterning the circuit layer, after the integrating of the insulating material, the circuit layer, the metal layer, and the fastening unit, wherein the preparing of the substrate in which the fastening unit is buried at the predetermined depth in the thickness direction includes:

preparing an insulating material;

forming a trench of a predetermined depth on one surface of the insulating material;

disposing a circuit layer from which a portion corresponding to the trench is removed, on one surface of the insulating material;

disposing a metal layer on the other surface of the insulating layer; and integrating the insulating material, the circuit layer, the metal layer, and the fastening unit, wherein the semiconductor chip is mounted on the chip mounting pad, wherein the fastening unit is made of a conductive material, and the external connection pad is formed to contact the fastening unit.

10. The method as set forth in claim 8, wherein the fastening unit is made of a nonconductive material, and
the method further comprising:
forming a lead frame for electrically connecting the external connection terminal to the external connection pad, after the forming of the chip mounting pad and the external connection pad.

11. The method as set forth in claim 7, wherein the integrating of the insulating material, the circuit layer, the metal layer, and the fastening unit is performed through heating and co-firing.

12. The method as set forth in claim 1, further comprising:
forming a molding member that covers the one surface of the substrate and the semiconductor chip by injecting a molding material into the case, after the forming of the case.

* * * * *